United States Patent
Melik-Martirosian

(10) Patent No.: US 8,819,503 B2
(45) Date of Patent: Aug. 26, 2014

(54) APPARATUS AND METHOD FOR DETERMINING AN OPERATING CONDITION OF A MEMORY CELL BASED ON CYCLE INFORMATION

(75) Inventor: Ashot Melik-Martirosian, San Diego, CA (US)

(73) Assignee: STEC, Inc., Santa Ana, CA (US)

( * ) Notice: Subject to any disclaimer, the term of this patent is extended or adjusted under 35 U.S.C. 154(b) by 391 days.

(21) Appl. No.: 13/044,464

(22) Filed: Mar. 9, 2011

(65) Prior Publication Data

US 2012/0239991 A1  Sep. 20, 2012

Related U.S. Application Data

(60) Provisional application No. 61/361,288, filed on Jul. 2, 2010.

(51) Int. Cl.
   *G11C 29/00* (2006.01)
(52) U.S. Cl.
   USPC .......................... 714/721; 714/704
(58) Field of Classification Search
   USPC ......................... 714/708, 704, 721
   See application file for complete search history.

(56) References Cited

U.S. PATENT DOCUMENTS

| | | | |
|---|---|---|---|
| 5,729,489 A | 3/1998 | Fazio et al. | |
| 6,396,742 B1 | 5/2002 | Korsh et al. | |
| 6,429,785 B1 * | 8/2002 | Griffin et al. | 340/870.02 |
| 6,519,184 B2 | 2/2003 | Tanaka et al. | |
| 6,643,177 B1 | 11/2003 | Le et al. | |
| 6,675,071 B1 * | 1/2004 | Griffin et al. | 700/286 |
| 6,888,758 B1 | 5/2005 | Hemink et al. | |
| 6,928,001 B2 | 8/2005 | Avni et al. | |
| 6,937,521 B2 | 8/2005 | Avni et al. | |
| 7,009,889 B2 | 3/2006 | Tran et al. | |
| 7,054,199 B2 | 5/2006 | Lee et al. | |
| 7,173,852 B2 * | 2/2007 | Gorobets et al. | 365/185.09 |
| 7,599,208 B2 * | 10/2009 | Kang | 365/145 |
| 7,613,045 B2 | 11/2009 | Murin et al. | |
| 7,656,707 B2 | 2/2010 | Kozlov | |
| 7,812,389 B2 * | 10/2010 | Tanaka et al. | 257/314 |
| 8,072,805 B2 | 12/2011 | Chou et al. | |

(Continued)

OTHER PUBLICATIONS

Hongchao Zhou; Anxiao Jiang; Bruck, J., "Error-correcting schemes with dynamic thresholds in nonvolatile memories," Information Theory Proceedings (ISIT), 2011 IEEE International Symposium on , vol., no., pp. 2143,2147, Jul. 31, 2011-Aug. 5, 2011.*

(Continued)

*Primary Examiner* — Cynthia Britt
(74) *Attorney, Agent, or Firm* — McDermott Will & Emery LLP

(57) ABSTRACT

Disclosed is an apparatus and method for adjusting a memory parameter in a non-volatile memory circuit. On a trigger event, a parameter is determined in accordance with a circuit characteristic associated with the memory block. The parameter may be a new read level voltage to apply to a page of a memory block, or a program verify level voltage used to program a page of a memory block. On determining the parameter a command is sent to the memory circuit to apply the parameter to the page of the memory block. The method can be triggered by an event such as P/E cycle times and the condition is dynamically adjusted to extend the life of the memory circuit.

18 Claims, 9 Drawing Sheets

(56) References Cited

U.S. PATENT DOCUMENTS

| | | | |
|---|---|---|---|
| 8,086,225 B2* | 12/2011 | Lee | 455/418 |
| 8,315,092 B2 | 11/2012 | Strasser et al. | |
| 2002/0174394 A1* | 11/2002 | Ledford et al. | 714/733 |
| 2005/0125199 A1* | 6/2005 | Slaight | 702/186 |
| 2005/0144358 A1* | 6/2005 | Conley et al. | 711/103 |
| 2005/0248999 A1* | 11/2005 | Tamura et al. | 365/200 |
| 2006/0039196 A1* | 2/2006 | Gorobets et al. | 365/185.01 |
| 2006/0061795 A1* | 3/2006 | Walmsley | 358/1.14 |
| 2006/0244041 A1* | 11/2006 | Tanaka et al. | 257/315 |
| 2008/0229164 A1* | 9/2008 | Tamura et al. | 714/721 |
| 2009/0104900 A1* | 4/2009 | Lee | 455/418 |
| 2009/0109756 A1 | 4/2009 | Aritome | |
| 2009/0187785 A1* | 7/2009 | Gonzalez et al. | 714/5 |
| 2009/0259916 A1 | 10/2009 | Hsu et al. | |
| 2009/0282189 A1* | 11/2009 | Best et al. | 711/106 |
| 2010/0008137 A1 | 1/2010 | Jang et al. | |
| 2010/0110748 A1* | 5/2010 | Best | 365/51 |
| 2010/0118608 A1 | 5/2010 | Song et al. | |
| 2010/0180073 A1 | 7/2010 | Weingarten et al. | |
| 2010/0315873 A1* | 12/2010 | Lee | 365/185.03 |
| 2011/0055468 A1* | 3/2011 | Gonzalez et al. | 711/103 |
| 2011/0167305 A1 | 7/2011 | Haratsch et al. | |
| 2011/0188291 A1* | 8/2011 | Chevallier et al. | 365/148 |
| 2011/0219203 A1 | 9/2011 | Nurminen et al. | |
| 2012/0017138 A1* | 1/2012 | Erez et al. | 714/773 |
| 2012/0147660 A1* | 6/2012 | Chevallier et al. | 365/148 |
| 2012/0236641 A1 | 9/2012 | Hu | |
| 2012/0239991 A1 | 9/2012 | Melik-Martirosian | |
| 2012/0319585 A1* | 12/2012 | Shteynberg et al. | 315/112 |
| 2013/0007344 A1* | 1/2013 | Belgal et al. | 711/103 |
| 2013/0097362 A1* | 4/2013 | Tan et al. | 711/103 |

OTHER PUBLICATIONS

Yu Cai; Yalcin, G.; Mutlu, O.; Haratsch, E.F.; Cristal, A.; Unsal, O.S.; Ken Mai, "Flash correct-and-refresh: Retention-aware error management for increased flash memory lifetime," Computer Design (ICCD), 2012 IEEE 30th International Conference on , vol., no., pp. 94,101, Sep. 30, 2012-Oct. 3, 2012.*

Shih-Liang Chen; Bo-Ru Ke; Jian-Nan Chen; Chih-Tsun Huang, "Reliability analysis and improvement for multi-level non-volatile memories with soft information," Design Automation Conference (DAC), 2011 48th ACM/EDAC/IEEE , vol., no., pp. 753,758, Jun. 5-9, 2011.*

* cited by examiner

APPARATUS AND METHOD FOR DETERMINING AN OPERATING CONDITION OF A MEMORY CELL BASED ON CYCLE INFORMATION

CROSS-REFERENCES TO RELATED APPLICATIONS

This application claims priority from U.S. Provisional Application No. 61/361,288, filed Jul. 2, 2010, which is incorporated herein by reference in its entirety.

TECHNICAL FIELD

The subject technology relates generally to memory devices and in particular multi-level cell flash memory devices.

BACKGROUND

Flash memory bears little resemblance to a magnetic recording system. Commodity flash chips are closed systems with no external access to analog signals, in sharp contrast to the typical Hard Disk Drive (HDD) where analog signals have always been available for study. Even though the HDD is a complex electro-mechanical system and can suffer catastrophic failure, it has been possible to engineer drives to have a life expectancy with little to no degradation in performance, which last beyond their time of technical obsolescence. Flash memory, on the other hand, has a finite life expectancy with gradual degradation in performance through the life cycle. Even so, since flash memory was first conceived as a memory device the target error rate at the output of the chip has been very low, as opposed to systems where stronger Error Correction Coding (ECC) may be used.

Lower priced Solid State Drives (SSD) are typically manufactured using multi-level cell (MLC) flash memory for increased data capacity, but MLC is less reliable than single-level cell (SLC) flash memory. Consumer SSD manufacturers have mitigated such problems by employing interleaving, special writing algorithms, and/or providing excess capacity in conjunction with wear-leveling algorithms. MLC flash endurance, however, has not been proven acceptable for enterprise SSD applications. Even with the increased data capacity of MLC, it becomes more expensive in enterprise applications because of its disproportionately large program/erase (P/E) cycle reduction due to increased (wear causing) stresses that are required to read, program, and erase the flash, causing a degradation in endurance.

SUMMARY

Disclosed is a method for adjusting a memory parameter associated with a non-volatile memory circuit. In one aspect, the method includes monitoring the memory circuit for a trigger event, and, on the trigger event, determining the memory parameter in accordance with a circuit characteristic associated with a memory block of the memory circuit, and providing to the memory circuit a command representative of an instruction to apply the determined memory parameter to a group of memory cells of the memory block. In another aspect, the method for adjusting a memory parameter associated with a non-volatile memory circuit is included as part of a machine-readable medium.

Also disclosed is a system for adjusting a memory parameter associated with a non-volatile memory circuit. In one aspect, the system includes a host interface configured to be operably coupled to a host device, to receive data from the host device, and to send data to the host device, a memory interface operably coupled to the memory circuit, a storage medium interface operably coupled to a volatile memory, and a controller operably coupled to the host interface. In this regard, the controller is operable to monitor the memory circuit for a trigger event, and, on the trigger event, determine the memory parameter in accordance with a circuit characteristic associated with a memory block of the memory circuit, and provide to the memory circuit a command representative of an instruction to apply the determined memory parameter to a group of memory cells of the memory block.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

A detailed description will be made with reference to the accompanying drawings.

DETAILED DESCRIPTION

Figure 1:
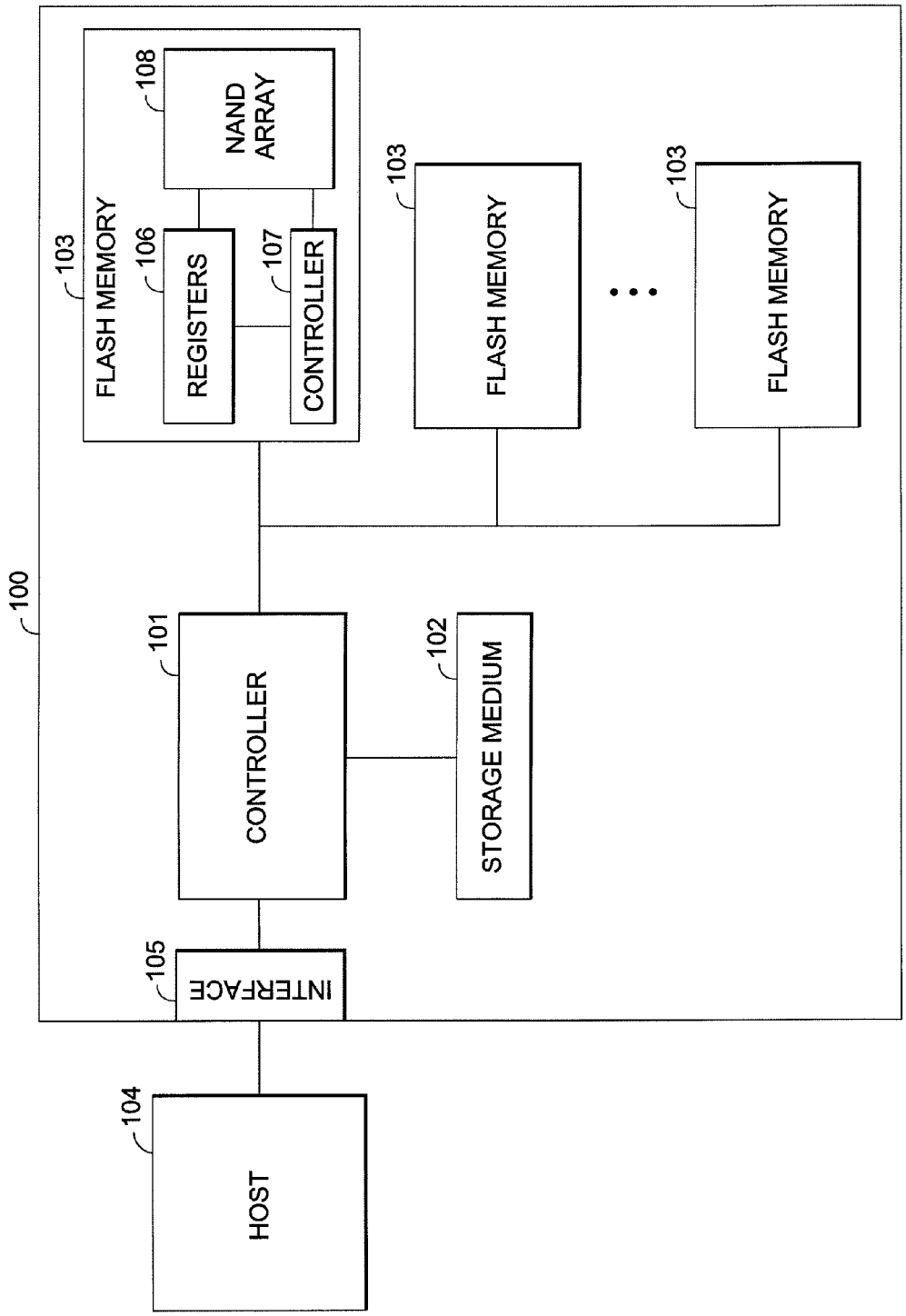
FIG. 1 is a block diagram illustrating components of a data storage system according to one aspect of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

In a flash memory device, for example, with NAND architecture, memory cells are grouped in strings, with each string consisting of a set of transistors connected in series between a drain select transistor, connected to a bit line of the memory block, and a source select transistor, connected to a reference voltage distribution line. Each memory cell includes a floating-gate MOS transistor. When programming a memory cell, electrons are injected into the floating-gate, for example, by means of Fowler-Nordheim (F-N) Tunneling. The non-volatility of the cell is due the electrons maintained within the floating-gate. Bits are stored by trapping charge on the floating gate (an electrically isolated conductor) which stores a logic value defined by its threshold voltage (read threshold) commensurate with the electric charge stored. When the cell is erased, the electrons in the floating gate are removed by quantum tunneling (a tunnel current) from the floating gate to, for example, the source and/or substrate.

As flash memory is cycled (that is, programmed and erased repeatedly), its physical qualities change. For example, the repeated placement and removal of electrons to and from the floating gate during programming and erase operations, respectively, causes some excess electrons to be trapped in the device. Also, when one or multiple cells are programmed, adjacent cells may experience an unexpected and undesired charge injection to their floating gates, thus leading to corruption of data stored therein. For instance, electrons may leak into neighboring cells after prolonged stress due to the voltages at the gates of neighboring cells. The threshold voltages of these memory cells may eventually take values that are different (higher or lower) than expected values, causing errors when the data is read. Generally, the damage done becomes a function of the field strength (voltage) and duration; that is, programming the flash memory to high threshold voltage conditions increases the rate of damage arising from both program and erase processes because it requires longer duration and/or higher applied fields. For instance, adding enough electrons can change a cell from an erased state to a programmed state.

In NAND architecture, it has been found that the problem of degradation is especially problematic because each transistor in the string of the cells being read receives an elevated voltage stress. Read retry capability has been introduced to perform data re-read when read errors exceed error correction capability, however, read performances are only further degraded by the number of read retries performed. Endurance has been sacrificed to meet the requirements of mainstream consumer flash applications, which require flash to have low cost, long retention time, fast programming/erase, and low error rate to work with unsophisticated controllers. Contrary to industry practice, the subject technology provides a system and process for use in flash memory cell architectures that reduces the variation in P/E performance, achieves a higher number of P/E cycles a flash memory device can undergo, and reduces bit error rate (BER), thereby improving the reliability and endurance of flash memory making it suitable for enterprise applications.

FIG. 1 is a block diagram illustrating components of a data storage system according to one aspect of the subject technology. As depicted in FIG. 1, in some aspects, data storage system 100 (for example, a solid state drive) includes data storage controller 101, storage medium 102, and flash memory 103. Controller 101 may use storage medium 102 for temporary storage of data and information used to manage data storage system 100. Controller 101 may include several internal components (not shown) such as a read-only memory, a flash component interface (for example, a multiplexer to manage instruction and data transport along a serial connection to flash memory 103), an I/O interface, error correction circuitry, and the like. In some aspects, all of these elements of controller 101 may be integrated into a single chip. In other aspects, these elements may be separated on their own PC board.

Controller 101 may also include a processor that may be configured to execute code or instructions to perform the operations and functionality described herein, manage request flow and address mappings, and to perform calculations and generate commands. The processor of controller 101 is configured to monitor and control the operation of the components in data storage controller 101. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 101 and/or its processor. One or more sequences of instructions may be software stored and read from storage medium 102, flash memory 103, or received from host device 104 (for example, via host interface 105). ROM, storage medium 102, flash memory 103, represent examples of machine or computer readable media on which instructions/code executable by controller 101 and/or its processor may be stored. Machine or computer readable media may generally refer to any medium or media used to provide instructions to controller 101 and/or its processor, including both volatile media, such as dynamic memory used for storage media 102 or for buffers within controller 101, and non-volatile media, such as electronic media, optical media, and magnetic media.

In some aspects, controller 101 is configured to store data received from a host device 104 in flash memory 103 in response to a write command from host device 104. Controller 101 is further configured to read data stored in flash memory 103 and to transfer the read data to host device 104 in response to a read command from host device 104. As will be described in more detail below, controller 101 is configured to adjust memory operating conditions (for example, read levels and/or program verify levels associated with a block of memory) as the number of P/E cycles increases and/or a block's retention time increases. By dynamically adjusting the operating conditions of flash memory 103, the subject technology may increase the number of P/E operations that may be performed on memory cells (not shown) within flash memory 103 at an acceptable BER level and for an expected retention time, as compared to the number of P/E operations that may be performed on memory cells operating in the same application environment without the ability to dynamically adjust memory operating conditions.

Host device 104 represents any device configured to be coupled to data storage system 100 and to store data in data storage system 100. Host device 104 may be a computing system such as a personal computer, a server, a workstation, a laptop computer, PDA, smart phone, and the like. Alternatively, host device 104 may be an electronic device such as a digital camera, a digital audio player, a digital video recorder, and the like.

In some aspects, storage medium 102 represents volatile memory used to temporarily store data and information used to manage data storage system 100. According to one aspect of the subject technology, storage medium 102 is random access memory (RAM) such as double data rate (DDR) RAM. Other types of RAM also may be used to implement storage medium 102. Memory 102 may be implemented using a single RAM module or multiple RAM modules. While storage medium 102 is depicted as being distinct from controller 101, those skilled in the art will recognize that storage medium 102 may be incorporated into controller 101 without departing from the scope of the subject technology. Alternatively, storage medium 102 may be a non-volatile memory such as a magnetic disk, flash memory, peripheral SSD, and the like.

As further depicted in FIG. 1, data storage system 100 may also include host interface 105. Host interface 105 is configured to be coupled to host device 104, to receive data from host device 104 and to send data to host device 104. Host interface 105 may include both electrical and physical connections for operably coupling host device 104 to controller 101, for example, via the I/O interface of controller 101. Host interface 105 is configured to communicate data, addresses, and control signals between host device 104 and controller 101. Alternatively, the I/O interface of controller 101 may include and/or be combined with host interface 105. Host interface 105 may be configured to implement a standard interface, such as Serial-Attached SCSI (SAS), Fiber Channel interface, PCI Express (PCIe), SATA, USB, and the like. Host interface 105 may be configured to implement only one interface. Alternatively, host interface 105 (and/or the I/O interface of controller 101) may be configured to implement multiple interfaces, which are individually selectable using a configuration parameter selected by a user or programmed at the time of assembly. Host interface 105 may include one or more buffers for buffering transmissions between host device 104 and controller 101.

Flash memory 103 represents a non-volatile memory device for storing data. According to one aspect of the subject technology, flash memory 103 includes, for example, a NAND flash memory. Flash memory 103 may include a single flash memory device or chip, or, as depicted by FIG. 1, may include multiple flash memory devices or chips arranged in multiple channels. Flash memory 103 is not limited to any particular capacity or configuration. For example, the number of physical blocks, the number of physical pages per physical block, the number of sectors per physical page, and the size of the sectors may vary within the scope of the subject technology.

Flash memory may have a standard interface specification. This standard ensures that chips from multiple manufacturers can be used interchangeably (at least to a large degree). The interface hides the inner working of the flash memory and returns only internally detected bit values for data. In one aspect, the interface of flash memory 103 is used to access one or more internal registers 106 and an internal flash controller 107 for communication by external devices. In some aspects, registers 106 may include address, command, and/or data registers, which internally retrieve and output the necessary data to and from a NAND memory cell array 108. For example, a data register may include data to be stored in memory array 108, or data after a fetch from memory array 108, and may also be used for temporary data storage and/or act like a buffer. An address register may store the memory address from which data will be fetched to host 104 or the address to which data will be sent and stored. In some aspects, a command register is included to control parity, interrupt control, and the like. In some aspects, internal flash controller 107 is accessible via a control register to control the general behavior of flash memory 103. Internal flash controller 107 and/or the control register may control the number of stop bits, word length, receiver clock source, and may also control switching the addressing mode, paging control, coprocessor control, and the like.

In some aspects, registers 106 may also include a test register. The test register may be accessed by specific addresses and/or data combinations provided at the interface of flash memory 103 (for example, by specialized software provided by the manufacturer to perform various tests on the internal components of the flash memory). In further aspects, the test register may be used to access and/or modify other internal registers, for example the command and/or control registers. In some aspects, test modes accessible via the test register may be used to input or modify certain programming conditions of flash memory 103 (for example, read levels and/or program verify levels) to dynamically vary how data is read from and/or programmed to the memory cells of memory arrays 108.

Figure 2:
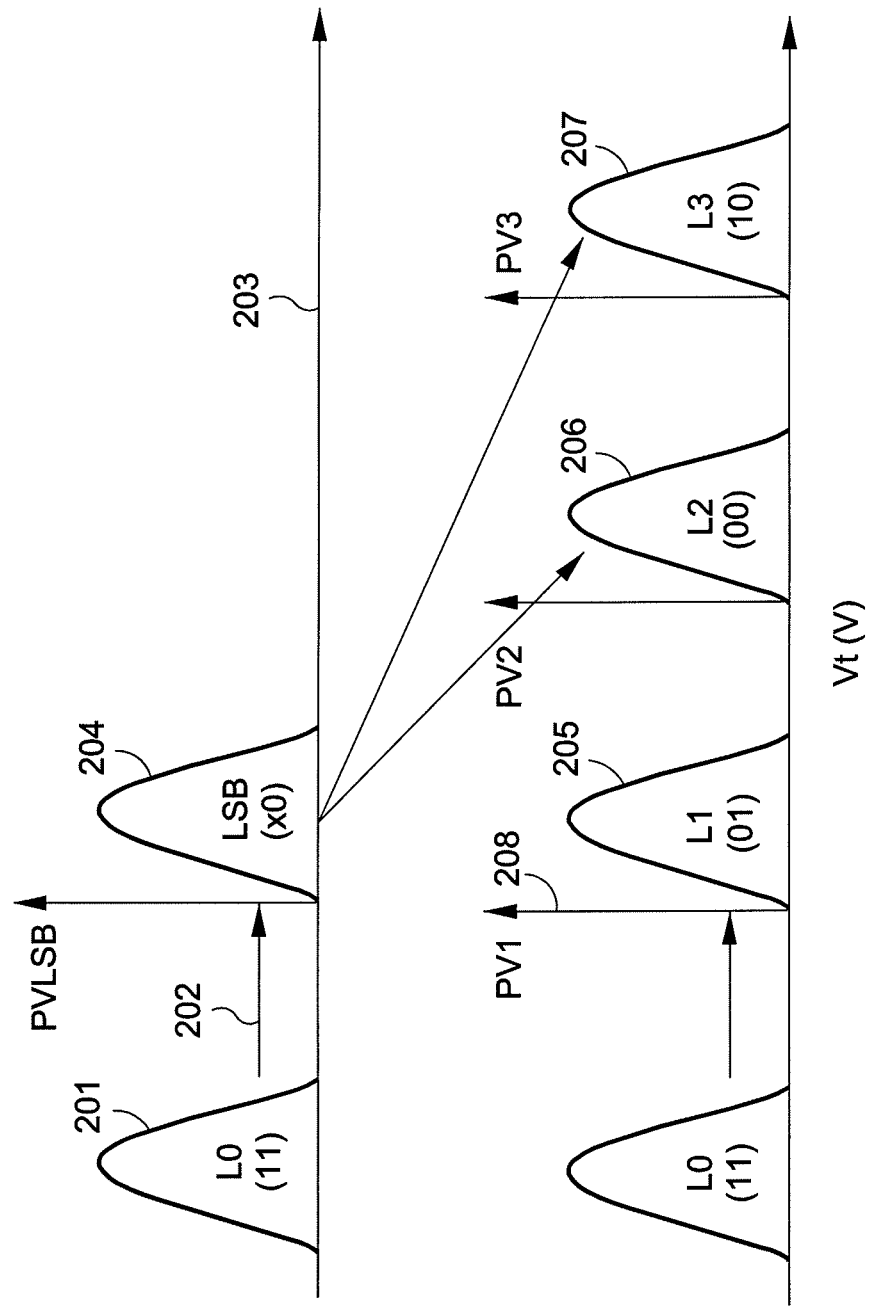
FIG. 2 is a diagram illustrating an exemplary graph diagram of four possible cell $V_T$ distributions and complimentary program verify levels in a multi-level cell flash memory according to one aspect of the subject technology.

The storage capacity of SSDs can be increased using MLC NAND flash memory. MLC provides for more than one bit per cell by choosing between multiple amounts of electrical charge to store in the floating gates of its cells to achieve multiple states of conductivity, each occurring at a different voltage threshold $V_T$. FIG. 2 is a diagram illustrating an exemplary graph diagram of four possible cell $V_T$ distributions and complimentary program verify levels in a multi-level cell flash memory according to one aspect of the subject technology. As depicted, a MLC NAND cell is capable of storing four states (amounts of charge) per cell, yielding two logical bits of information per cell: the Most Significant Bit (MSB) and the Least Significant Bit (LSB). These two bits may make up corresponding MSB and LSB pages of a memory block. In some aspects, a NAND memory block is programmed one page at a time using an Incremental Step Programming Procedure (ISPP). In some aspects, the ISPP is performed by flash controller 107 in response to one or more commands received from controller 101.

For example, the memory cells that are to be programmed may be selected at the bit line. A "page operation" may be performed to apply a voltage at the gates of each cell in the memory page. A corresponding selection at the bit lines creates a voltage potential in the selected group of memory cells where the LSB is selected to be different (for example, binary 10 or 00) than the erased L0 distribution state 201 (for example, binary 11). Accordingly, ISPP increases 202 the threshold voltage $V_T$ 203 of the selected group of cells to create LSB distribution 204. Then, in a similar manner, during a MSB page program operation, ISPP is applied to create an L1 distribution 205 from the erased L0 distribution 201 (for example, binary 01), or, an L2 distribution 206 (for example, binary 00) or L3 distribution 207 (for example, binary 10) from the previously programmed LSB distribution 204. In some aspects, all of the above distributions are created from L0 distribution 201 by applying a series of ISPP voltage pulses to the memory cells of the page which is being programmed. In some aspects, the ISPP includes a series of voltage pulses that are applied in a step pattern with the amplitude of each pulse incrementally increased with increasing pulse number, starting from a certain starting magnitude. In some aspects, flash controller 107 of flash memory 103 may perform a programming verification (sensing)

operation in between each step. To verify that a cell has been successfully programmed, controller 107 applies a program verify voltage 208 in an attempt to measure the threshold voltage of the cell. In some aspects, if the threshold voltage of a cell in the memory page is detected above a certain program verify level, flash controller 107 may stop further programming of that single cell by setting it to a program inhibit state.

In some aspects, LSB and MSB programming may use different values of ISPP starting magnitude and/or ISPP step magnitude. Accordingly, a different ISPP step and/or starting magnitudes can be used during the MSB programming of L1 distribution 205 than in the programming of L2 distribution 206 and/or L3 distribution 207. This is because programming to a higher $V_T$ level requires the application of a higher programming voltage potential. It has been found that higher programming pulse magnitudes result in faster programming, and smaller ISPP step magnitudes and/or narrower pulse widths result in narrower final $V_T$ distributions (for example, a distribution of cells programmed to the same $V_T$ distribution having a smaller standard deviation). In some aspects, these parameter values may be stored in storage medium 102 and accessed by controller 101 to determine (for example, calculate) further values and/or issue commands to flash memory 103. Controller 101 is configured to communicate with flash memory 103 via registers 106 (for example, the test register) and/or flash controller 107 to provide commands for modifying certain parameters (for example, nominal parameters set by the chip manufacturer) of flash memory 103 to vary the $V_T$ distributions at run-time and/or to vary the voltages applied to read the memory cells (read levels). As will be further described, these parameters can be dynamically determined and/or adjusted at run-time as a function of various circuit characteristics (for example, P/E cycle, retention time, BER, temperature) and/or in response to commands received from host 104 via host interface 105.

Figure 3:
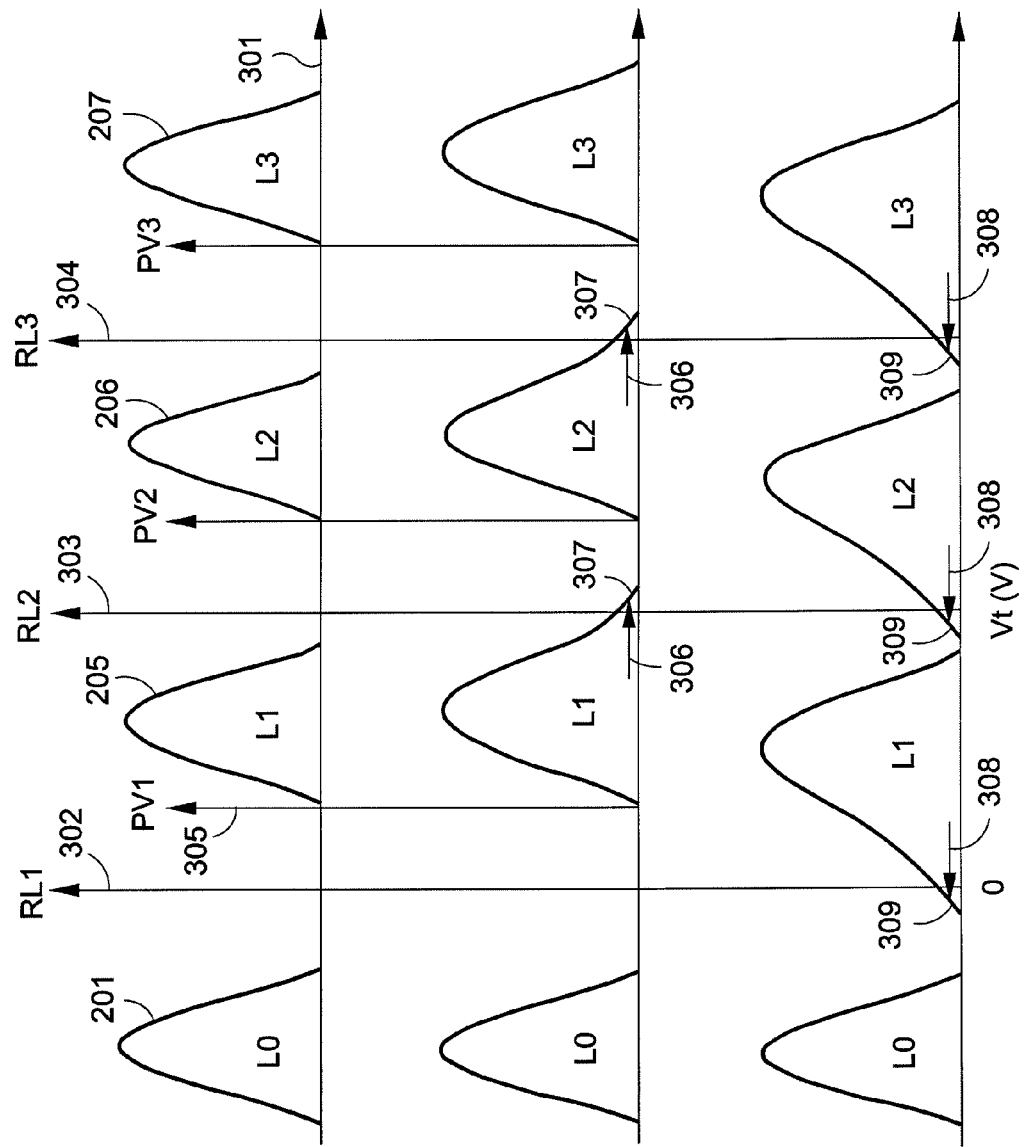
FIG. 3 is a graph diagram illustrating an exemplary threshold voltage evolution of a 2-bit MLC NAND flash memory cell with read levels and program verify levels chosen apriori at beginning of life according to one aspect of the subject technology.

FIG. 3 is a graph diagram illustrating an exemplary threshold voltage evolution of a 2-bit MLC NAND flash memory cell with read levels and program verify levels chosen apriori at beginning of life according to one aspect of the subject technology. The topmost row represents the four distributions at a memory cell's beginning of life (BOL). The respective programming distributions of L0 distribution 201, L1 distribution 205, L2 distribution 206, and L3 distribution 207 are shown along a voltage threshold continuum 301. The middle row of FIG. 3 depicts an exemplary progression of the programming distributions after repeated P/E cycling. The buildup of electrons trapped on the floating gates of the memory cells has caused some cells to be programmed to higher voltage thresholds (increasing the standard deviation at a higher $V_T$). This shift 306 in voltage thresholds may eventually cause the right edges of the $V_T$ distributions to reach the higher adjacent read levels. When the $V_T$ distributions cross 307 the higher read levels, the likelihood that a read operation will produce an error increases. The bottom row depicts an exemplary result of an extended retention time on the memory cells. After a number of P/E cycles, some of the memory cells that have not been cycled have lost electrons, causing their voltage thresholds to decrease. This shift 308 may eventually cause the left edges of the $V_T$ distributions to reach the lower adjacent read levels. The bigger the number of P/E operations performed on the memory cells and the longer the retention time, the more extreme the decrease in the voltage thresholds of the memory cells. If the read levels remain fixed, the $V_T$ distributions that have crossed 309 the next lower read level may cause significant errors.

With reference to the top row of FIG. 3, after ISPP, the edges of each of the distributions are suitably spaced from adjacent read levels. In some aspects, spacing can be altered by setting program verify voltages 305 (for example, PV1, PV2, and/or PV3) during the verification operation sufficiently higher than a lower read level, but sufficiently low enough to prevent even those cells in the distribution having the highest $V_T$ (largest deviation) from crossing the next higher read level. To ensure that all cells in a distribution will conduct, a read level voltage greater than the distribution is applied. In this regard, RL1 voltage 302 will cause cells in L0 distribution 201 to conduct, RL2 voltage 303 will cause cells in L1 distribution 205 to conduct, RL3 voltage 304 will cause cells in L2 distribution to conduct, and so on. Where, as depicted by FIG. 3, only four states are available, RL voltage 304 will not cause any cells in L3 distribution 207 to conduct, thereby generating a binary x0 in the LSB (see FIG. 2) for those cells. Generally, for N distributions there will be N-1 read levels. In the depicted example, there are four distributions (states) and three read levels. Those skilled in the art will recognize that there may be eight, sixteen, or more distributions without departing from the scope of the subject technology.

Figure 4:
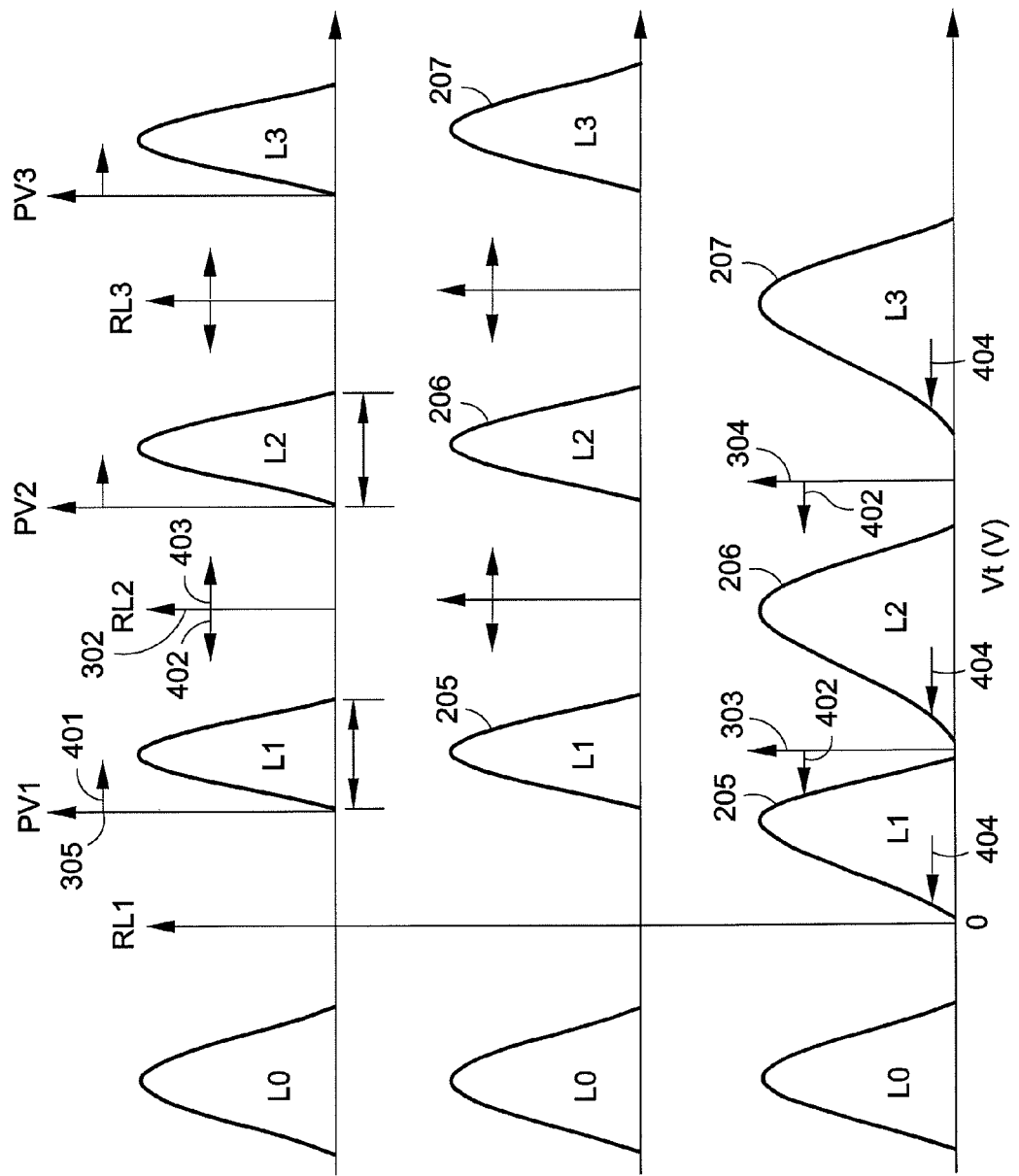
FIG. 4 is a graph diagram illustrating adjustable read levels and program verify levels according to one aspect of the subject technology.

FIG. 4 is a graph diagram illustrating adjustable read levels and program verify levels according to one aspect of the subject technology. The topmost row depicts the possible adjustment of read levels and program verify levels in relation to four $V_T$ distributions at BOL, the middle row depicts the possible adjustment of read levels in response to a progression of the distributions after repeated P/E operations are performed, and the bottom row depicts the possible adjustment of read levels in response to an extended retention time. In one aspect, controller 101 is configured to shift program verify levels 305 to higher values (for example, higher voltages) to reduce the bit error rate (BER) resulting from shift 308 experienced during data retention as P/E cycles increase. Controller 101 may, after a number of P/E cycles (for example, 20 k cycles), compensate for shift 308 by shifting 401 program verify level 305 as part of ISPP to create a higher $V_T$ distribution (program the cells to a higher voltage threshold value). This adjustment may, for example, adjust the program verify levels by incremental values of 20 mV, 30 mV, 100 mV, 500 mV, etc., or multiples of these incremental values. The incremental value and/or total amount by which the program verify levels can be adjusted may vary depending on the memory chip specifications and/or other qualities set by the manufacturer and the subject technology is not limited to any particular value or values.

The determination of the adjusted program verify level 305 may be based on cycle information and/or other characteristics related to flash memory 103. For example, in other aspects, controller 101 may monitor retention time and perform the determination based on the retention time after a certain number of cycles. By moving the program verify level 305 higher, the $V_T$ distributions (for example, L1, L2, L3) are squeezed and/or narrowed, which increases the gaps between the distributions and allows the flash memory cells to tolerate more cycles (increasing endurance) and retain programming levels longer (increased retention) before BER gets too large.

In some aspects, storage system 100 maintains one or more lookup tables (for example, on storage medium 102) for storing values pertaining to program verify levels 305. The one or more lookup tables may store a program verify level adjustment to be applied to all distributions, or store values for each program verify level separately so that each may be adjusted differently than others. The values may be indexed by a number or range of P/E cycles, retention time, BER, distance from adjacent read level(s), and/or a temperature (for example, the die temperature of flash memory 103). Controller 101 indexes the lookup table by current condition (for example, P/E cycle, retention time, BER, temperature) to retrieve the value for program verify level 305. In that regard, as the condition(s) related to flash memory 103 change over time, controller 101 may index the lookup table to determine the correct program verify level 305 to use for the changed condition(s). Controller 101 programs flash memory 103 with the adjusted program verify level 305 to be used during the next programming cycle. In some aspects, controller 101 provides program verify level 305 to flash memory 103 by setting values of registers 106 (for example, the test register), and/or by sending one or more commands to internal flash controller 107. In other aspects, controller 101 may shift 401 program verify level 305 at beginning of life (BOL) to a higher value, for example, than the default value provided by the flash manufacturer, in anticipation of extended retention times. In further aspects, controller 101 may determine a lower program verify level 305 to reduce BER (for example, due to excessive cycling).

In another aspect, as the cycle count increases, controller 101 is configured to adjust read levels (for example, read level 303) to higher or lower values to reduce BER and extend the endurance of flash memory 103. In some aspects, after an extended retention time, controller 101 is configured to reduce 402 read levels to prevent higher distributions from crossing lower read levels. In other aspects, after a predetermined number of P/E cycles, controller 101 is configured to increase 403 read levels to prevent lower distributions from crossing higher read levels. In some aspects, read levels are incrementally adjusted by a specific value. In further aspects, read levels are adjusted toward the middle of a window between $V_T$ distributions. These adjustments may, for example, adjust the read levels by incremental values of 20 mV, 30 mV, 100 mV, 500 mV, etc., or multiples of these incremental values. The incremental value and/or total amount by which the read levels can be adjusted may vary depending on the memory chip specifications and/or other qualities set by the manufacturer and the subject technology is not limited to any particular value or values.

Similar to the procedure described previously with regard to program verify levels, read levels may be based on dynamically changing information. As the condition(s) related to flash memory 103 change over time, controller 101 may index one or more read level lookup tables to determine a new read level to use for the changed condition(s) when instructing flash memory 103 to read a page and/or block of memory cells. As described previously with regard to program verify lookup tables, the one or more lookup tables may store a single read level adjustment to be applied to all read levels, or store values for each read level separately so that each may be adjusted differently than others. Read levels may be indexed by a number or range of P/E cycles, retention time, BER, distance from adjacent read level(s), distance from adjacent program verify level(s), and/or a temperature (for example, the die temperature of flash memory 103). In some aspects, controller 101 provides a new read level to flash memory 103 by setting values of registers 106 (for example, the test register), and/or by sending one or more commands to internal flash controller 107. It is also contemplated for controller 101 to send commands to flash memory 103 to decrease or increase a read level by a certain amount.

The previously described lookup tables (for example, for program voltage levels and/or read levels) may be initially populated by data collected from the simulation of a flash memory or test data received from testing a die similar to flash memory 103. For example, the flash memory may be cycled to a specific number of cycles (for example, 20 k cycles) and values for read levels and/or program verify levels selected for each distribution (for example, L1, L2, and L3) to reduce BER. In another aspect, the flash memory device may be baked for a period of time in an oven (for example, 3 hours at 100 C) to simulate the BER that would have resulted from loss of charge due to retaining data over a predetermined number of cycles. Once the values are selected, they are stored in the one or more lookup tables and indexed by the cycle count. In some aspects, the one or more tables may also be indexed by retention time. The process may then be repeated to select values at successive intervals (for example, "BOL", "low cycles", "mid cycles", "EOL").

A combination of read levels and program verify levels generating the lowest BER may be found for each adjustment period (number of cycles or length of retention time). In some aspects, the adjustment period may be at least partially determined by a predetermined maximum acceptable BER. The maximum acceptable BER may be determined by a maximum number of bits correctable by ECC. In one exemplary procedure, program verify levels (first PV1, and then PV2 and PV3) are optimized by increasing the levels by +500 mV with respect to their default values. Then, RL1 is fixed at 0V, and RL2 and RL3 are adjusted ±500 mV at each adjustment period to minimize BER (actual adjustment may be dependent on chip specification and/or other qualities set by the manufacturer). If, for example, certain memory cells were programmed to a specific distribution (for example, L1 205) and, after the flash memory die is baked, BER is too high then a transition (for example, from L1 to L0) may be declared and an adjustment made (see FIG. 4). If BER is too high after successive cycling, a transition (for example, from L2 to L3) may be declared. The number of bit errors is proportional to the number of "transitions" that occur when an edge of a $V_T$ distribution crosses an adjacent read level (for example, FIG. 3, bottom row). In some aspects, the adjustment can be made to minimize transitions within the capability of ECC. In another exemplary procedure, to maintain an estimated 10 transitions or less, PV1 and PV2 are increased by 180 mV, while PV3 is increased by 270 mV. At BOL and at 20 k cycles, RL2 is decreased −60 mV and RL3 is increased +90 mV with respect to their default values. After a retention bake was performed, RL2 is shifted down −240 mV and RL3 is shifted down −90 mV with respect to their default values. In view of this disclosure, those skilled in the art will recognize how to simulate and/or test flash memory in order to select adjusted read levels and/or program verify levels (at each level of cell distribution) for placement in their respective one or more lookup tables.

With reference to FIG. 4, bottom row, it is not necessary that the distance between read levels remain fixed. In some aspects, the distributions may not remain equidistant from each other with time. Controller 101 may be configured to account for fluctuating $V_T$ distributions and may adjust the read levels to suit varying levels of distribution (for example, L0, L1, L2, L3). For example, after a number of cycles, the distributions of cells retaining data may shift 404 to the left (the cells in the distribution losing charge/$V_T$), with L2 distribution 206 and L3 distribution 207 experiencing a greater shift 404 than L1 distribution 205. In this exemplary scenario, controller 101 may retrieve the respective read level values from the one or more read level lookup tables and program flash memory 103 to reduce 402 read level 303 and read level 304. Read level 303 may be lowered to prevent L2 distribution 206 from crossing read level 303 but maintained high enough as to not cross the higher thresholds of L1 distribution 205. Similarly, read level 304 will be lowered to prevent the lower thresholds of L3 distribution 207 from crossing read level 304, but maintained high enough as to not cross the higher thresholds of L2 distribution 206. In this regard, the read level lookup table may include for each changed condition an additional index by distribution. For example, the read level lookup table may include three different read level values to be used when reading a block for a designated range of P/E cycles. When controller 101 determines that the block has experienced a number of P/E cycles falling within the range, the three read levels are programmed into flash memory 103 to be used during read operations for the range of cycles. Controller 101 may determine and/or lookup three new values for the next range. Likewise, the different read level values can be stored in the lookup table by retention times.

In one aspect, controller 101 may also periodically perform one or more checks to determine BER (for example, to determine the influence of program verify levels on $V_T$ distributions) and adjusts program verify levels based on the checks. For instance, if the check(s) determine that program verify levels create BER outside of a predetermined range, the program verify levels are adjusted 401 to shift the $V_T$ distributions and bring the BER back into range. Similarly, in another aspect, controller 101 may adjust read levels based on the checks. If, for example, the check(s) determine that the current read levels create a BER outside of a preferred range, the read levels may be adjusted to reduce BER. In other aspects, controller 101 may adjust read levels to accommodate BER produced by an adjustment in program verify level (and vice versa).

Controller 101 may be configured to receive a page and/or block of data and process that data using ECC (for example, an ECC algorithm) to determine BER. Controller 101 may use the level of BER to determine whether a $V_T$ distribution is too high. In this regard, controller 101 uses ECC to accommodate a certain level of BER. However, controller 101 may also be configured to adjust the read levels and/or program verify levels in accordance with the previously described procedure based on an increase in BER (for example, at a specific value or error slope/acceleration).

In some aspects, the frequency of the checks is minimized to prevent diminished performance. The read levels and program verify levels may be adjusted simultaneously or individually at different intervals (that is, read level adjustment may occur at a different time/interval than a program verify levels adjustment). Controller 101 may be configured to perform the check during a service mode scheduled by controller 101 or preprogrammed (for example, in storage medium 102) according to a predetermined schedule (for example, on or after a number of P/E cycles). The checks may be performed before or after an operation (for example, a read or write operation).

In some aspects, controller 101 is programmed to determine and/or adjust the read levels and/or program verify levels on a trigger event. In some aspects, the trigger event may be a number or range of P/E cycles or a retention time. In one aspect, controller 101 is configured to monitor one or more of these characteristics and to invoke a trigger event when the monitored characteristic exceeds a predetermined limit. On the trigger event, controller 101 is configured to determine and adjust the read levels and/or program verify levels to new values to extend the life of flash memory 103 while maintaining acceptable BER. In some aspects, the same trigger event will trigger adjustment of both read levels and program verify levels. In other aspects, the trigger events are separate for read levels and program verify levels, based on the foregoing characteristics which can be monitored by controller 101 with a certain periodicity (for example, after a certain number of P/E cycles).

In some aspects, controller 101 may access a trigger lookup table stored on storage medium 102 to determine when a trigger should take place. The lookup table may provide trigger information based on a number of P/E cycles or range of cycles and/or a retention time. In some aspects, read level and/or program verify level shifts are planned as the drive ages through one or more cycle and/or timestamp lookup tables. Once a trigger event is met (for example, "BOL", "low cycles", "mid cycles", "EOL"), controller 101 accesses the lookup table to facilitate adjustment of the read levels and/or program verify levels. Where the trigger event is based on a number or range of P/E cycles, the number or range used can either be an average across all memory blocks in flash memory 103 or based on individual memory block information. Depending on the observed block-to-block and chip-to-chip variation, a dynamic adjustment can be performed on all flash memories 103 in storage system 100 at once, on individual chips, on individual pages, or on individual blocks.

Briefly referring to FIG. 3, controller 101 may be configured to program flash memory 103 so that, once a predetermined BER is reached or exceeded after a predetermined number of cycles (for example, some of the cells in L1 distribution 205 are beyond read level 303), one or more read levels are adjusted so that further programming of the page does not cause cells in the distribution having larger $V_T$ magnitudes to become too close to the adjacent higher read level (for example, read level 303). Similarly, when reprogramming a distribution (for example, L1 distribution 205) after a predetermined retention time (see FIG. 3, bottom row), program verify levels may be increased to move the left edge of the distribution away from an adjacent lower read level (for example, read level 302). Resetting program verify levels may have an impact on read levels. In some aspects, controller 101 may set one or more program verify levels as a function of one or more read levels (and vice versa) to maintain BER within predefined limits. For example, if controller 101 determines that a new program verify level would render an unacceptable BER (for example, a $V_T$ distribution crossing a higher read level), controller 101 is programmed to determine and adjust the read levels (for example, to higher levels) to maintain an acceptable BER. Likewise, if setting a new read level would render a BER unacceptable (for example, after extended retention time), controller 101 is programmed to determine and adjust one or more program verify levels (for example, to higher or lower levels) to maintain an acceptable BER.

Figure 5:
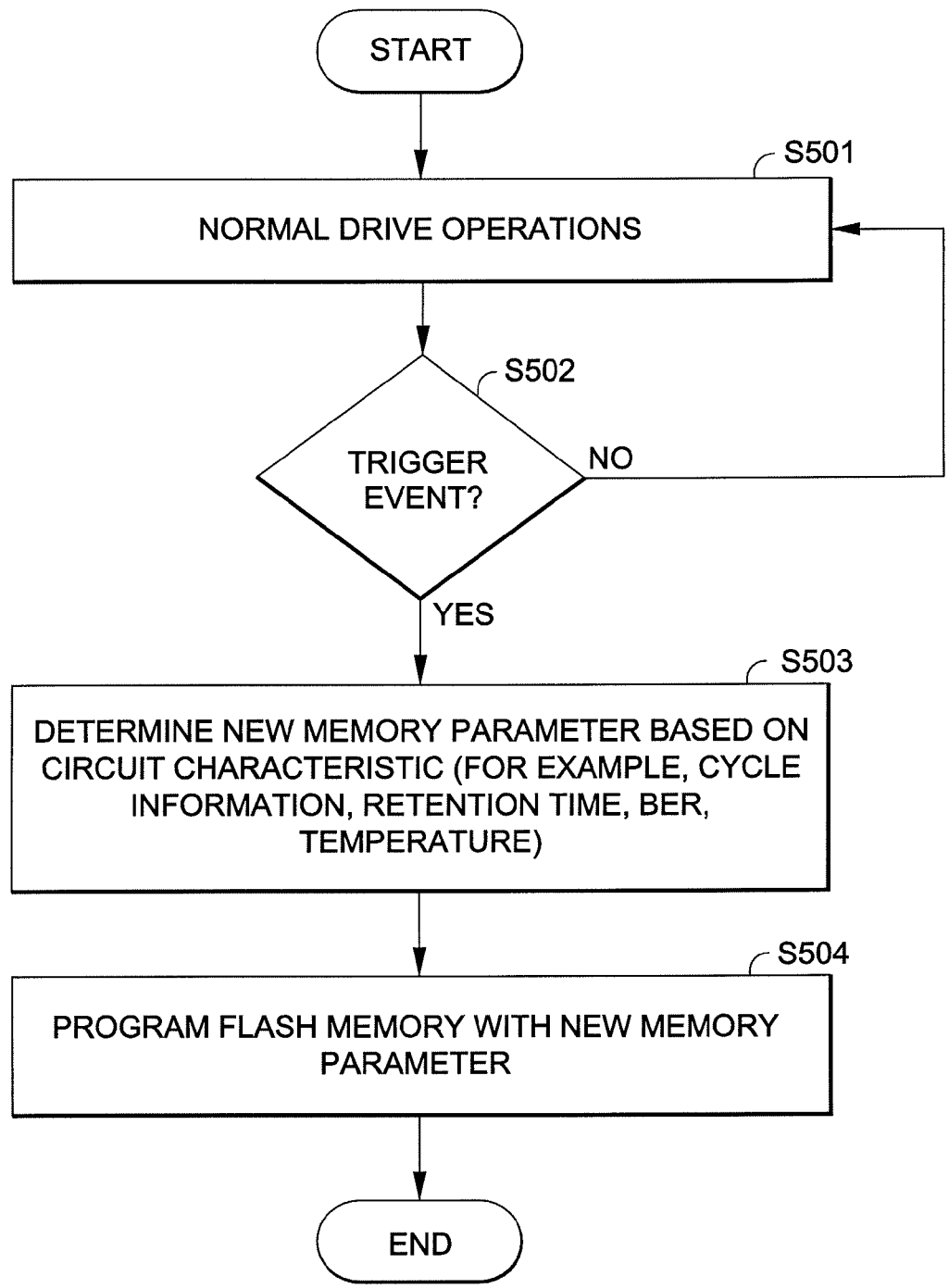
FIG. 5 is a flowchart illustrating a process for a method for adjusting a memory parameter associated with a non-volatile memory circuit based on a circuit characteristic according to one aspect of the subject technology.

FIG. 5 is a flowchart illustrating a process for method for adjusting a memory parameter associated with a non-volatile memory circuit based on a circuit characteristic according to one aspect of the subject technology. In step S501, storage system 100, including controller 101, is in normal drive operation. Controller 101 is configured to monitor a circuit characteristic of flash memory 103 (for example, P/E cycle or retention time) to determine if a trigger event has occurred. For example, the trigger event may occur when the value of the characteristic reaches a specific limit and/or range. Controller 101 may store a characteristic value limit and/or range (for example, in storage medium 102) for immediate reference during drive operation. In some aspects, the limit and/or range may be part of software executed by controller 101. In step S502, controller 101 determines whether the trigger event has occurred, and, if it has, moves to step S503. Otherwise, normal drive operations are continued. Controller 101, in step S503, accesses a parameter table to retrieve a new memory parameter (for example, read level or program verify level) based on the currently monitored characteristic. In one aspect, the parameter lookup table is indexed by identifiable ranges of characteristic values. Controller 101 may index the table using the block's currently monitored characteristic value to obtain the new parameter. Once the parameter is obtained, in step S504, controller 101 programs flash memory 103 with the new parameter.

Figure 6:
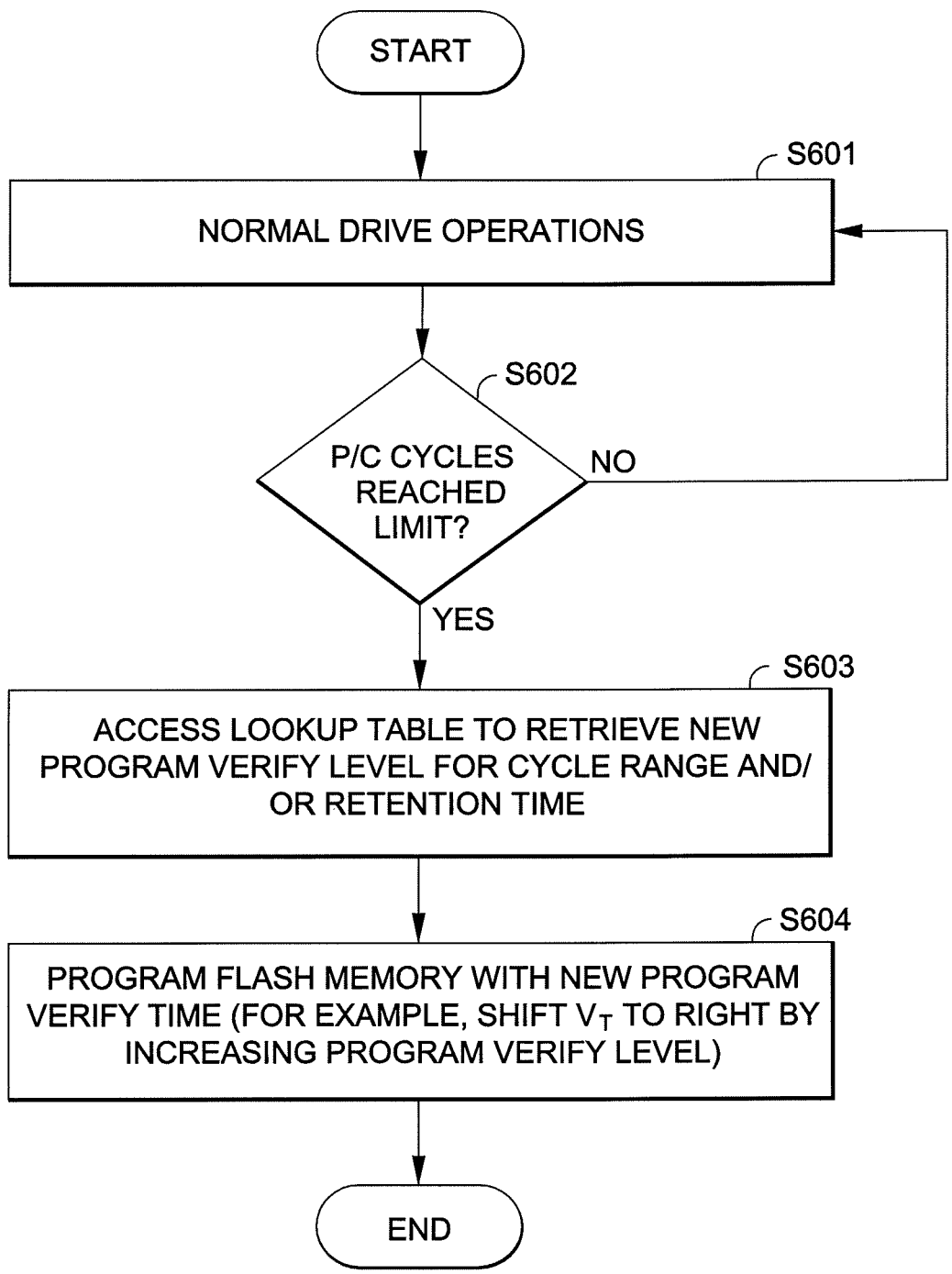
FIG. 6 is a flowchart illustrating a process for shifting a program verify level based on a number of P/E cycles according to one aspect of the subject technology.

FIG. 6 is a flowchart illustrating a process for shifting a program verify level based on a number of P/E cycles according to one aspect of the subject technology. In step S601, storage system 100, including controller 101, is in normal drive operation. In the depicted aspect, controller 101 is configured to monitor the number of P/E cycles experienced by a memory block in flash memory 103. Controller 101 may store a number or range of P/E cycles (for example, in storage medium 102) for immediate reference during normal drive operation. In some aspects, the number or range of P/E cycles may be part of software executed by controller 101. In step S602, controller 101 determines that the memory block has reached a specific number of P/E cycles (for example, a limit) and/or entered a range of P/E cycles, and, if it has, moves to step S603. Otherwise normal drive operations are continued. In one aspect, a program verify level lookup table is indexed by a range of P/E cycles. Controller 101, in step S603, accesses the lookup table and indexes the table using the current P/E cycle number to obtain the new program verify level based on the range of P/E cycles. Once the program verify level is obtained, in step S604, controller 101 programs flash memory 103 using the new program verify level. In the depicted aspect, the new program verify level is a higher value than the previous value. Thus, the new program verify level will act in conjunction with the next ISPP to shift 401 the $V_T$ distribution (for example, L1, L2, or L3) of the cells in the page and/or block being written to higher values (see FIG. 4, top row). Those skilled in the art will recognize that a similar procedure can be used to adjust the new program verify level to a lower value.

Alternatively, controller 101 may be configured to monitor the retention time of a memory block (for example, time since a block was last programmed) in flash memory 103. Controller 101 may store a specific retention limit and/or range of retention times (for example, in storage medium 102) for immediate reference during normal drive operation. In some aspects, the retention limit and/or range may be part of software executed by controller 101. Controller 101 monitors flash memory 103 and determines whether the memory block has reached a retention time. Controller 101 accesses a program verify lookup table to retrieve a new program verify level for the retention time. In one aspect, the program verify lookup table is indexed by identifiable ranges of retention times. Controller 101 may index the table using the block's retention time to obtain the new program verify level based on a range of retention times. In some aspects, the program verify level adjustment (FIG. 5 or FIG. 6) is performed based on retention time and a number of P/E cycles. In this regard, the lookup table may provide two levels of indexing. Controller 101 may first index the table using the current P/E cycle number, then perform an additional index to obtain the new program verify level based on the retention time (or vice versa).

Figure 7:
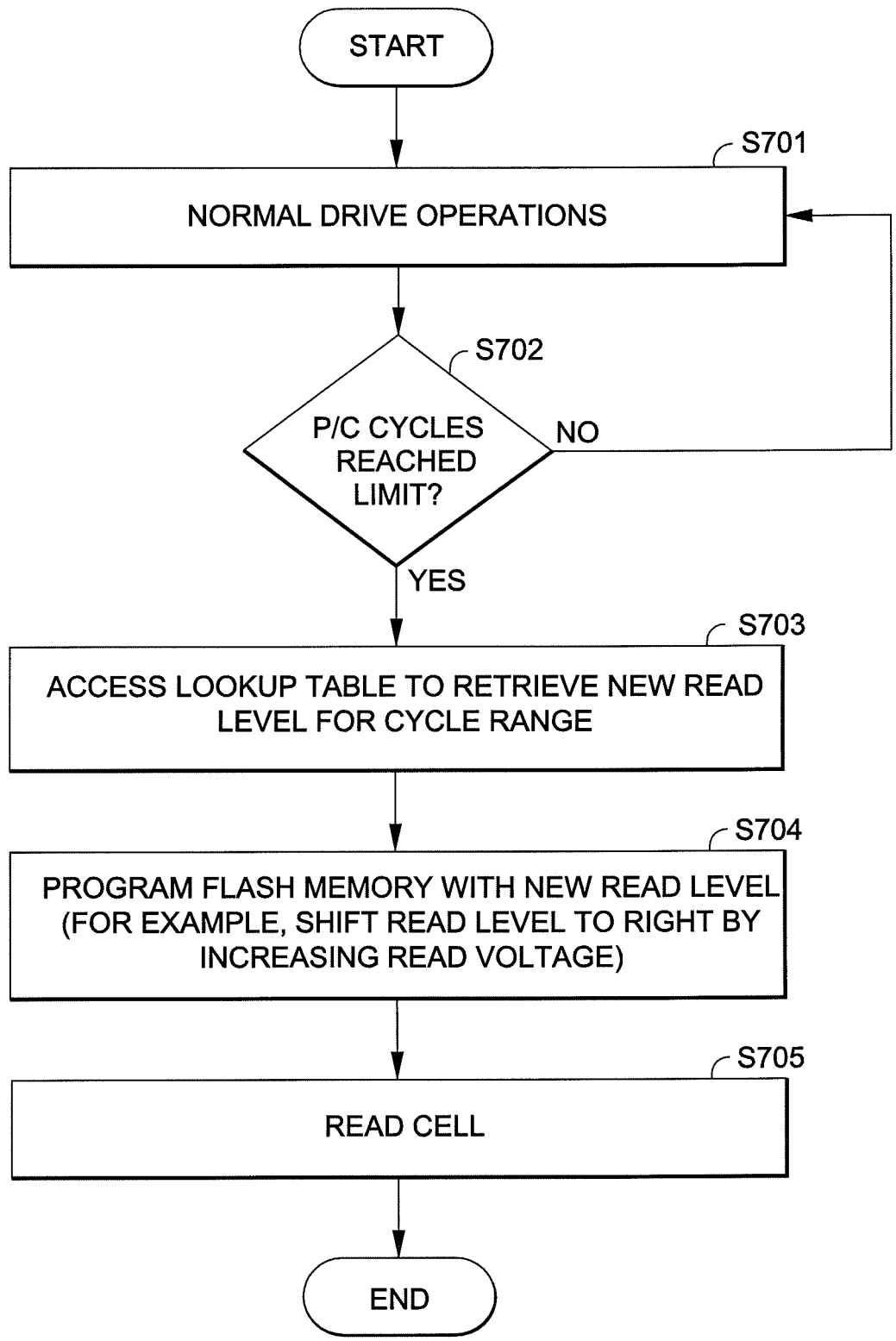
FIG. 7 is a flowchart illustrating a process for shifting a read level based on a number of P/E cycles according to one aspect of the subject technology.

FIG. 7 is a flowchart illustrating a process for shifting a read level based on a number of P/E cycles according to one aspect of the subject technology. In step S701, storage system 100, including controller 101, is in normal drive operation. In the depicted aspect, controller 101 is configured to monitor the number of P/E cycles experienced by a memory block in flash memory 103. Controller 101 may store a number or range of P/E cycles (for example, in storage medium 102) for immediate reference during normal drive operation. In some aspects, the number or range of P/E cycles may be part of software executed by controller 101. In step S702, controller 101 determines that the memory block has reached a specific number of P/E cycles (for example, a limit) and/or entered a range of P/E cycles, and, if it has, moves to step S703. Otherwise normal drive operations are continued. In one aspect, the read level lookup table is indexed by a range of P/E cycles. Controller 101, in step S703, indexes the lookup table using the current P/E cycle number to obtain the new program verify level based on a range of P/E cycles. Once the read level is obtained, in step S704, controller 101 programs flash memory 103 with the new read level. In the depicted aspect, the new read level is a higher value than the previous value. Thus, the new read level will act in conjunction with the next read operation in step S705, effectively shifting 403 the voltage levels used to read the cells in the page and/or block being read to higher values (see FIG. 4, middle row).

Figure 8:
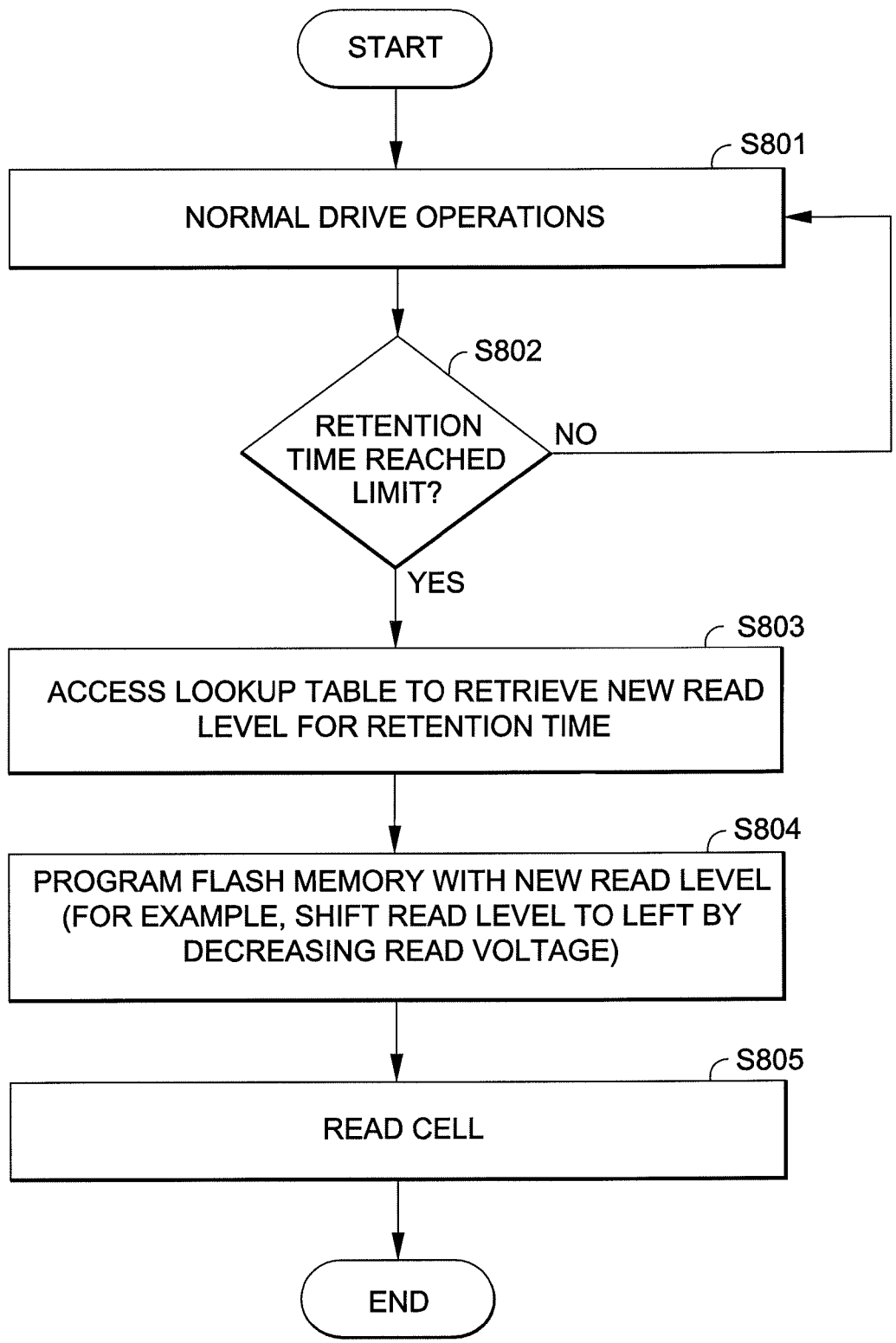
FIG. 8 is a flowchart illustrating a process for shifting a read level based on retention time according to one aspect of the subject technology.

FIG. 8 is a flowchart illustrating a process for shifting a read level based on retention time according to one aspect of the subject technology. In step S801, storage system 100, including controller 101, is in normal drive operation. In the depicted aspect, controller 101 is configured to monitor the retention time of a memory block in flash memory 103. Controller 101 may store a specific retention limit and/or range of retention times (for example, in storage medium 102) for immediate reference during normal drive operation. In some aspects, the retention limit and/or range may be part of software executed by controller 101. In step S802, controller 101 determines whether the memory block has reached a retention time, and, if it has, moves to step S803. Otherwise normal drive operations are continued. Controller 101, in step S803, accesses a read level lookup table to retrieve a new read level for the retention time. In one aspect, the read level lookup table is indexed by identifiable ranges of retention times. Controller 101 may index the table using the block's retention time to obtain the new read level based on a range of retention times. Once the read level is obtained, in step S804, controller 101 programs flash memory 103 with the new read level. In the depicted aspect, the new read level is a lower value than the previous value. Thus, the new read level will act in conjunction with the next read operation in step S805, effectively shifting 402 the voltage levels used to read the cells in the page and/or block being read to lower values (see FIG. 4, bottom row). In some aspects, the read level adjustment (FIG. 5 or FIG. 6) is performed based on retention time and a number of P/E cycles. In this regard, the lookup table may provide two levels of indexing. Controller 101 may first index the table using the current P/E cycle number, then perform an additional index to obtain the new read level based on the retention time (or vice versa).

Figure 9:
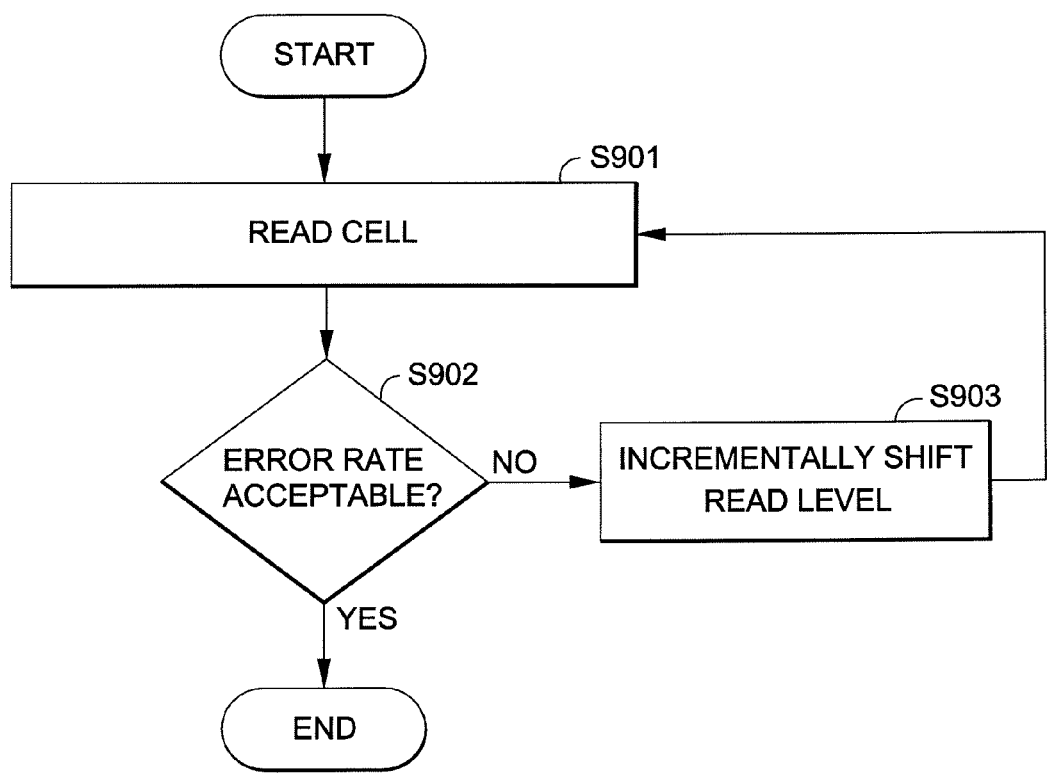
FIG. 9 is a flowchart illustrating a process for iteratively adjusting a read level based on error rate according to one aspect of the subject technology.

Once flash memory 103 has degraded to a point where BER is approaching a maximum allowed BER, the read levels can be adjusted by performing a search in a loop driven by error rate. FIG. 9 is a flowchart illustrating a process for iteratively adjusting a read level based on error rate according to one aspect of the subject technology. In step S901, controller 101 reads a page and/or block of flash memory 103 (for example, in step S605 or S705) and a BER is obtained for the read operation. In step S902, controller S902 determines whether the BER is acceptable. Controller 101 may store a specific BER limit (for example, in storage medium 102) for immediate reference during normal drive operation. In some aspects, the BER limit (and/or range of BER) may be determined by software executed by controller 101 (for example, ECC). If the BER is at an acceptable value, the normal drive operations are continued. If the BER is unacceptable (beyond the BER limit) then, in step S903, controller 101 will adjust the read levels by an incremental value prior to attempting to execute a new read operation. In some aspects, controller 101 will determine the incremental value based on stored information from previous read level adjustments and/or recent program verify level adjustments and/or values. For example, if a corresponding program verify level was recently increased (see FIG. 5), then controller 101 may choose to increase the read level. However, if an increase in read level is causing excessive BER, then controller may decrease the read level in smaller steps. Those skilled in the art will recognize how to determine whether a particular BER is acceptable or unacceptable. After the read level has been incremented by step S903, the process returns to step S901 and controller 101 attempts to re-read the page and/or block. The process loops until the BER is reduced to an acceptable value, after which the read operation is completed, data returned, and normal drive operations continue.

Choosing memory read levels and/or program verify levels statically at the beginning of life (BOL) in 2-bit/cell MLC NAND flash devices, results in wide SSD performance variation and limits the number of P/E cycles a memory device can undergo, given the maximum acceptable BER level and the expected retention time. Contrary to industry practice, program verify levels and/or read levels are not fixed apriori. In some aspects, they are dynamically adjusted to conform to flash degradation, and thus moving, voltage threshold distributions as the memory device degrades during cycling and retention. In some aspects, they are dynamically adjusted to reduce bit error rates (BER). For the same level of maximum acceptable BER and the same expected retention time, the subject technology allows one to achieve a higher number of P/E cycles the device can undergo. Similarly, for the same number of P/E cycles and the same expected retention time the subject technology allows the SSD to achieve a lower BER, markedly improving SSD performance throughout the lifetime of the drive. The adjustment occurs during run-time, for example, when the drive is in operation. It is thus an object of the subject technology to provide the dynamic adjustment herein described to improve SSD performance throughout the lifetime of the drive, and, to allow, for the same level of maximum acceptable BER and the same expected retention time, the device to achieve a higher number of P/E cycles, and, for the same number of P/E cycles and the same expected retention time, achieve a lower BER.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A method for adjusting memory parameters associated with a non-volatile memory circuit, comprising:
monitoring a group of memory cells of the memory circuit for a trigger event, the trigger event occurring when a number of P/E cycles associated with the group of memory cells satisfies a cycle limit; and
on the trigger event:
determining an adjusted read level in accordance with a the number of P/E cycles associated with the group of memory cells based on indexing a lookup table by the number of P/E cycles to obtain the adjusted read level; and
providing to the memory circuit a command to apply the determined adjusted read level to the group of memory cells of the memory circuit;
wherein the adjusted read level is applied to subsequent read operations.

2. The method of claim 1, wherein the adjusted read level is set to a higher value than a current read level.

3. The method of claim 1, wherein the adjusted read level is set to a lower value than a current read level.

4. The method of claim 1, further comprising:
obtaining a bit error rate in connection with reading the group of memory cells, wherein the trigger event includes the bit error rate satisfying a predetermined value.

5. A system for adjusting memory parameters associated with a non-volatile memory circuit, comprising:
a host interface configured to be operably coupled to a host device, to receive data from the host device, and to send data to the host device;
a memory interface operably coupled to the memory circuit; and
a controller operably coupled to the host interface, wherein the controller is operable to:
monitor the memory circuit for a trigger event, the trigger event occurring when a number of P/E cycles associated with the group of memory cells satisfies a cycle limit; and
on the trigger event:
determine an adjusted read level in accordance with the number of P/E cycles associated with the group of memory cells based on indexing a lookup table by the number of P/E cycles to obtain the adjusted read level; and
provide to the memory circuit a command to apply the determined adjusted read level to the group of memory cells of the memory circuit;
wherein the adjusted read level is applied to subsequent read operations.

6. The system of claim 5, wherein the controller being operable to determine the adjusted read level includes controller being operable to set the adjusted read level to a higher value than a current read level.

7. The system of claim 5, wherein the controller is further operable to:
obtain a bit error rate in connection with reading the group of memory cells, wherein the trigger event includes the bit error rate satisfying a predetermined value.

8. A method for adjusting memory parameters associated with a non-volatile memory circuit comprising:
monitoring the memory circuit for a trigger event, the trigger event occurring when a retention time associated with a memory block of the memory circuit satisfies a retention limit; and
on the trigger event:
determining an adjusted program verify level in accordance with the retention time associated with the memory block by indexing a lookup table by the retention time to obtain the adjusted program verify level; and
providing to the memory circuit a command to apply the determined adjusted program verify level to memory cells of the memory block.

9. The method of claim 8, wherein the adjusted program verify level is set to a higher value than a current verify level.

10. The method of claim 8, further comprising:
obtaining a bit error rate in connection with reading the group of memory cells, wherein the trigger event includes the bit error rate satisfying a predetermined value.

11. A method for adjusting memory parameters associated with a non-volatile memory circuit comprising:
monitoring the memory circuit for a trigger event, the trigger event occurring when a retention time associated with a memory block of the memory circuit satisfies a retention limit; and
on the trigger event:
determining an adjusted read level in accordance with the retention time associated with the memory block by indexing a lookup table by the retention time to obtain the adjusted read level; and
providing to the memory circuit a command to apply the determined adjusted read level to memory cells of the memory block;
wherein the adjusted read level is applied to subsequent read operations.

12. The method of claim 11, further comprising:
obtaining a bit error rate in connection with reading the group of memory cells, wherein the trigger event includes the bit error rate satisfying a predetermined value.

13. A system for adjusting memory parameters associated with a non-volatile memory circuit, comprising:
a host interface configured to be operably coupled to a host device, to receive data from the host device, and to send data to the host device;
a memory interface operably coupled to the memory circuit; and
a controller operably coupled to the host interface, wherein the controller is operable to:
monitor the memory circuit for a trigger event, the trigger event occurring when a retention time associated with a memory block of the memory circuit satisfies a retention limit; and
on the trigger event:
determine an adjusted program verify level in accordance with the retention time by indexing a lookup table by the retention time to obtain the adjusted program verify level; and
provide to the memory circuit a command to apply the determined adjusted program verify level to memory cells of the memory block.

14. The system of claim 13, wherein determining the adjusted program verify level includes the controller being operable to set the adjusted program verify level to a higher value than a current verify level.

15. The system of claim 13, wherein the controller is further operable to:
  obtain a bit error rate in connection with reading the group of memory cells, wherein the trigger event includes the bit error rate satisfying a predetermined value.

16. A system for adjusting memory parameters associated with a non-volatile memory circuit, comprising:
  a host interface configured to be operably coupled to a host device, to receive data from the host device, and to send data to the host device;
  a memory interface operably coupled to the memory circuit; and
  a controller operably coupled to the host interface, wherein the controller is operable to:
    monitor the memory circuit for a trigger event, the trigger event occurring when a retention time associated with a memory block of the memory circuit satisfies a retention limit; and
    on the trigger event:
      determine an adjusted read level in accordance with the retention time by indexing a lookup table by the retention time to obtain the adjusted read level; and
      provide to the memory circuit a command to apply the determined adjusted read level to memory cells of the memory block;
    wherein the adjusted read level is applied to subsequent read operations.

17. The system of claim 16, wherein the controller being operable to determine the adjusted read level includes the controller being operable to set the adjusted read level to a lower value than a current read level.

18. The system of claim 16, wherein the controller is further operable to:
  obtain a bit error rate in connection with reading the group of memory cells, wherein the trigger event includes the bit error rate satisfying a predetermined value.

* * * * *